United States Patent
Lee et al.

(10) Patent No.: US 11,584,884 B2
(45) Date of Patent: Feb. 21, 2023

(54) LUMINESCENT MATERIAL, METHOD OF PREPARING THE SAME, AND LIGHT-EMITTING DEVICE INCLUDING THE SAME

(71) Applicant: Samsung Electronics Co., Ltd., Suwon-si (KR)

(72) Inventors: Yong Joo Lee, Suwon-si (KR); YongChurl Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 242 days.

(21) Appl. No.: 16/809,894

(22) Filed: Mar. 5, 2020

(65) Prior Publication Data

US 2021/0095197 A1    Apr. 1, 2021

(30) Foreign Application Priority Data

Sep. 27, 2019 (KR) .................. 10-2019-0119820

(51) Int. Cl.
    *C09K 11/58* (2006.01)
    *C09K 11/61* (2006.01)
    *H01L 33/06* (2010.01)
    *H01L 33/14* (2010.01)

(52) U.S. Cl.
    CPC .......... *C09K 11/586* (2013.01); *C09K 11/616* (2013.01); *H01L 33/06* (2013.01); *H01L 33/14* (2013.01)

(58) Field of Classification Search
None
See application file for complete search history.

(56) References Cited

U.S. PATENT DOCUMENTS

| | | | |
|---|---|---|---|
| 8,669,527 B2 | 3/2014 | Ueyama et al. | |
| 10,208,246 B2 | 2/2019 | Kawai et al. | |
| 2021/0002547 A1* | 1/2021 | Kim | C09K 11/616 |

FOREIGN PATENT DOCUMENTS

| | | |
|---|---|---|
| CN | 110117024 A | 8/2019 |
| JP | 2013036030 A | 8/2015 |
| KR | 1020160059463 A | 5/2016 |
| KR | 101659860 B1 | 9/2016 |
| KR | 1020180073165 A | 7/2018 |
| KR | 1020210002985 A | 1/2021 |
| WO | 2012169659 A1 | 12/2012 |

OTHER PUBLICATIONS

Kebin Lin, et al., Perovskite light-emitting diodes with external quantum efficiency exceeding 20 per cent, Oct. 11, 2018, vol. 62, Nature , 245, 15 pp.

Shijing Sun, et al.. Accelerating Photovoltaic Materials Development via High-Throughput Experiments and Machine-Learning-Assisted Diagnosis, 37 pp.

(Continued)

*Primary Examiner* — Hsien Ming Lee
(74) *Attorney, Agent, or Firm* — Cantor Colburn LLP

(57) ABSTRACT

A luminescent material represented by Formula 1, a method of preparing the same, and a light-emitting device including the same:

$$[A^1{}_nA^2{}_3][B_2][X^1{}_mX^2{}_5] \quad \text{Formula 1}$$

$A^1$, $A^2$, $B$, $X^1$, $X^2$, $n$, and $m$ in Formula 1 are as defined in the specification.

19 Claims, 5 Drawing Sheets

(56) References Cited

OTHER PUBLICATIONS

Taehwan Jun, et al., Lead-Free Highly Efficient Blue-Emitting Cs3Cu2I5 with 0D Electronic Structure, Adv. Mater. 2018, 1804547, 6 pp.
Extended European search report issued by the European Patent Office dated Oct. 22, 2020 in the examination of the European Patent Application No. 20175326.6, which corresponds to the U.S. Application above.
S. Hull, et al., Crystal Structures and Ionic Conductivities of Ternary Derivatives of the Silver abd Copper Monohalides (II), Journal of Solid State Chemistry 177 (2004) 3156-3173 (XP004537292).
Taehwan Jun, et al., Lead-Free Highly Efficient Blue-Emitting Cs3 Cu2I5 with 0D Electronic Structure, Adv. Mater. 2018, 30, 1804547 (6 pages), (XP055739103).

\* cited by examiner

LUMINESCENT MATERIAL, METHOD OF PREPARING THE SAME, AND LIGHT-EMITTING DEVICE INCLUDING THE SAME

CROSS-REFERENCE TO RELATED APPLICATION

This application claims priority to Korean Patent Application No. 10-2019-0119820, filed on Sep. 27, 2019 in the Korean Intellectual Property Office, and all the benefits accruing therefrom under 35 U.S.C. § 119, the entire content of which is herein incorporated by reference.

BACKGROUND

1. Field

The present disclosure relates to a luminescent material, a method of manufacturing the same, and a light-emitting device including the same.

2. Description of the Related Art

Light-emitting devices are devices having the capacity to convert electrical energy into light energy.

According to an example, a light-emitting device includes an anode, a cathode, and an emission layer interposed between the anode and the cathode. In addition, a hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and electrons recombine in the emission layer to produce excitons. These excitons transition from an excited state to the ground state to thereby generate light.

SUMMARY

Provided are a novel luminescent material, a method of preparing the same, a light-emitting device using the same. Particularly, provided are a novel luminescent material free of lead, a method of preparing the same, a light-emitting device using the same.

Additional aspects will be set forth in part in the description which follows and, in part, will be apparent from the description, or may be learned by practice of the presented embodiments.

According to an aspect of an embodiment, there is provided a luminescent material represented by Formula 1:

$$[A^1{}_nA^2{}_3][B_2][X^1{}_mX^2{}_5]$$ Formula 1 wherein, in Formula 1,
$A^1$ and $A^2$ are each independently at least one alkali metal,
B is at least one of Cu, Ag, or Au,
$X^1$ and $X^2$ are each independently at least one halogen;
n is a real number satisfying 0<n<1.5; and
m is a real number satisfying 0<m<1.5.

In an embodiment, $A^1$ may be at least one of Li, Na, K, Cs, or Rb, and $A^2$ may be Cs.

In an embodiment, $A^1$ may be at least one of Na, K, Cs, or Rb, and $A^2$ may be Cs.

In an embodiment, B may be Cu.

In an embodiment, $X^1$ and $X^2$ may be the same as each other.

In an embodiment, $X^1$ and $X^2$ may be both I.

In an embodiment, n may be a real number satisfying 0<n≤0.6, and m may be a real number satisfying 0<m≤0.6.

In an embodiment, the luminescent material may be represented by Formula 1-1;

$$[A^1{}_nCs_3][Cu_2][X^1{}_mI_5]$$ Formula 1-1 wherein, in Formula 1-1,
$A^1$, $X^1$, n, and m may be as defined above in Formula 1.

In an embodiment, the luminescent material may be a mixture of a first compound represented by Formula 1A and a second compound represented by Formula 1B:

$$[A^2{}_3][B_2][X^2{}_5]$$ Formula 1A $$A^1X^1$$ Formula 1B wherein, in Formulae 1A and 1B,
$A^1, A^2, B, X^1$, and $X^2$ may be as defined above in Formula 1.

In an embodiment, a molar ratio of the first compound to the second compound may be about 1:n or about 1:m.

In an embodiment, the first compound may be $Cs_3CuI_5$, and the second compound may be NaI, KI, CsI, or RbI.

In an embodiment, the luminescent material may have a maximum emission wavelength of about 420 nm or greater and about 520 nanometers (nm) or less.

In an embodiment, the luminescent material may have a full width at half maximum (FWHM) of about 100 nm or less, e.g., 20 nm to 80 nm.

According to an aspect of another embodiment, there is provided a method of preparing the luminescent material represented by Formula 1 above, the method including:
providing onto a substrate a mixture including at least one of $A^2X^2$-containing precursors, at least one of $BX^2$-containing precursors, at least one of $A^1X^1$-containing precursors, and a solvent;
performing crystallization by adding an anti-solvent; and
removing the solvent and the antisolvent by thermal treatment;

In an embodiment, a molar ratio of the at least one of the $A^2X^2$-containing precursors to the at least one of the $A^1X^1$-containing precursors may be greater than about 100:0 to less than about 100:50.

In an embodiment, a molar ratio of the at least one of the $A^2X^2$-containing precursors to the at least one of the $A^1X^1$-containing precursors may be greater than about 100:0 to about 100:20 or less.

In an embodiment, the solvent may be dimethyl formamide, dimethyl sulfoxide, γ-butyrolactone, N-methyl-2-pyrrolidone, or any combination thereof, and
the antisolvent may be diethyl ether, toluene, α-terpineol, hexyl carbitol (diethylene glycol hexyl ether), butyl carbitol acetate (diethylene glycol n-butyl ether acetate), hexyl cellosolve (ethylene glycol monohexyl ether), butyl cellosolve acetate (ethylene glycol n-butyl ether acetate), or any combination thereof.

According to an aspect of another embodiment, a light-emitting device includes: a first electrode; a second electrode opposite to the first electrode; and an emission layer interposed between the first electrode and the second electrode, wherein the emission layer includes the above-described luminescent material.

In an embodiment, the light-emitting device may further include a hole transport region interposed between the first electrode and the emission layer and/or an electron transport region interposed between the emission layer and the second electrode.

In an embodiment, the light-emitting device may further include a charge control layer between the first electrode and the emission layer and/or between the emission layer and the second electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, and so that this disclosure will be thorough and complete, and will fully convey the scope of the invention to those skilled in the art. Like reference numerals refer to like elements throughout.

The terminology used herein is for the purpose of describing particular embodiments only and is not intended to be limiting. "At least one" is not to be construed as limiting "a" or "an." "Or" means "and/or." As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings. Effects, features, and a method of achieving the present disclosure will be obvious by referring to example embodiments of the present disclosure with reference to the attached drawings. The present disclosure may, however, be embodied in many different forms and should not be construed as being limited to the embodiments set forth herein.

General and widely used terms have been employed herein, in consideration of functions provided in the present disclosure, and may vary according to an intention of one of ordinary skill in the art, a precedent, or emergence of new technologies. Additionally, in some cases, an applicant may arbitrarily select specific terms. Then, the applicant will provide the meaning of the terms in the description of the present disclosure. Accordingly, it will be understood that the terms used herein should be interpreted as having a meaning that is consistent with their meaning in the context of the relevant art and will not be interpreted in an idealized or overly formal sense unless expressly so defined herein.

As used herein, the terms such as "including," "having," or the like are intended to indicate the existence of the features or elements disclosed in the specification, and are not intended to preclude the possibility that one or more other features or elements may exist or may be added.

In the accompanying drawings, like reference numerals refer to like elements throughout and the sizes of elements are exaggerated or reduced for clarity and ease of description.

It will also be understood that when an element such as a layer, a film, a region or a component is referred to as being "on" another layer or element, it can be directly on the other layer or element, or intervening layers, regions, or components may also be present. When an element is referred to as being "directly or immediately on," this means that any intervening element is not present.

As used herein, the singular forms "a," "an," and "the" are intended to include the plural forms as well, unless the context clearly indicates otherwise.

As used herein, the term "Group" refers to a group of the IUPAC periodic table of elements.

As used herein, the term "alkali metal" refers to an element of Group 1.

As used herein, the term "halogen" refers to an element of Group 17.

As used herein, the term "maximum emission wavelength" refers to the wavelength at the maximum emission intensity in the photoluminescence (PL) spectrum of a sample prepared as a solution or film including a compound.

As used herein, the term "full width at half maximum (FWHM) refers to the wavelength width at half (½) of the maximum emission intensity in the PL spectrum.

Hereinafter, embodiments of a luminescent material, a method of manufacturing the same, and a light-emitting device including the same will be described in detail with reference to the appended drawings.

Luminescent Material

According to an embodiment, there is provided a luminescent material represented by Formula 1:

$$[A^1{}_nA^2{}_3][B_2][X^1{}_mX^2{}_5] \qquad \text{Formula 1}$$

wherein, in Formula 1,
$A^1$ is at least one of Li, Na, K, Cs, or Rb, and $A^2$ is Cs,
B is at least one of Cu, Ag, or Au,
$X^1$ and $X^2$ are each independently at least one halogen;
n is a real number satisfying 0<n≤0.9; and
m is a real number satisfying 0<m≤0.9.

In one or more embodiments, in Formula 1, $A^1$ may be Li, Na, K, Cs, or Rb, and $A^2$ may be Cs. For example, in Formula 1, $A^1$ may be Na, K, Cs, or Rb, and $A^2$ may be Cs.

In one or more embodiments, in Formula 1, $A^1$ may be Na or K.

In Formula 1, B may be at least one noble metal of Cu, Ag, or Au.

In one or more embodiments, in Formula 1, B may be Cu.

In one or more embodiments, in Formula 1, $A^1$ may be at least one of Na or K, $A^2$ is Cs, and B is Cu.

In Formula 1, $X^1$ and $X^2$ may each independently be at least one halogen.

As used herein, the term "at least one" that precedes "alkali metal," "noble metal," or "halogen" means that a luminescent material of Formula 1 can include alloyed or mixed metals or mixed halogen components of the material. For example, the language "$A^1$ and $A^2$ may each independently be at least one alkali metal" that refers to component $[A^1{}_nA^2{}_3]$ of Formula 1 includes not only binary systems, e.g., $NaCs_3$, but also more complex mixed inorganic systems, e.g., $Na_jK_kCs_3$, where j+k=n; or $Na_jK_kCs_oLi_p$, where o+p=3. This complex inorganic system is just one of many complex inorganic systems embodied by the luminescent materials of Formula 1 as long as the indices n and 3 for $A^1$ and $A^2$ are satisfied.

The term "at least one" also applies to the noble metals B, and therefore, the luminescent materials of Formula 1 includes alloys of Cu, Ag or Au. The same is true for the halogen, and therefore, the materials of Formula 1 includes mixed halide systems.

In one or more embodiments, in Formula 1, $X^1$ and $X^2$ may be the same as each other. For example, in Formula 1, $X^1$ and $X^2$ may be both I.

In Formula 1, n may be a real number satisfying 0<n<1.5.

In one or more embodiment, in Formula 1, n may be a real number satisfying 0<n≤1.2, a real number satisfying 0<n≤0.9, a real number satisfying 0<n≤0.6, a real number satisfying 0<n≤0.3, a real number satisfying 0<n≤0.09, or a real number satisfying 0<n≤0.06.

In Formula 1, m may be a real number satisfying 0<m≤1.5.

In one or more embodiments, in Formula 1, m may be a real number satisfying 0<m≤1.2, a real number satisfying 0<m≤0.9, a real number satisfying 0<m≤0.6, a real number satisfying 0<m≤0.3, a real number satisfying 0<m≤0.09, or a real number satisfying 0<m≤0.06.

For example, in Formula 1, n and m may be the same as each other. However, embodiments are not limited thereto.

In an embodiment, the luminescent material may be represented by Formula 1-1:

Formula 1-1

$[A^1{}_nCs_3][Cu_2][X^1{}_mI_5]$   Formula 1-1

In Formula 1-1, $A^1$, $X^1$, n, and m may be as defined above in Formula 1.

In an embodiment, the luminescent material may be a mixture of a first compound represented by Formula 1A and a second compound represented by Formula 1B:

Formula 1A $[A^2{}_3][B_2][X^2{}_5]$   Formula 1A

Formula 1B $A^1X^1$   Formula 1B

In Formulae 1A and 1B, $A^1$, $A^2$, B, $X^1$, and $X^2$ may be as defined in Formula 1.

That is, the first compound in the luminescent material may be in a form of crystals, and the second compound may not be in the crystals of the first compound, and instead, the second component may be present on the surface of the first compound. This may be confirmed by X-ray diffractometry (XRD) and energy dispersive X-ray spectroscopy (EDX), as indicated in the examples which will be described later.

In an embodiment, a molar ratio of the first compound to the second compound (a molar ratio of the second compound to the first compound) may be about 1:n, where n is as defined above. For example, n may be a real number satisfying 0<n≤1.2, a real number satisfying 0<n≤0.9, a real number satisfying 0<n≤0.6, a real number satisfying 0<n≤0.3, a real number satisfying 0<n≤0.15, a real number satisfying 0<n≤0.09, or a real number satisfying 0<n≤0.06.

In other embodiments, a molar ratio of the first compound to the second compound may be about 1:m, where m is as defined above. For example, m may be a real number satisfying 0<m≤1.2, a real number satisfying 0<m≤0.9, a real number satisfying 0<m≤0.6, a real number satisfying 0<m≤0.3, a real number satisfying 0<m≤0.15, a real number satisfying 0<m≤0.09, or a real number satisfying 0<m≤0.06.

In an embodiment, in Formula 1B, $A^1$ may be at least one of Li, Na, K, Cs, or Rb, and in Formula 1A, $A^2$ may be Cs. For example, in Formula 1B, $A^1$ may be at least one of Na, K, Cs, or Rb, and in Formula 1A, $A^2$ may be Cs.

In an embodiment, in Formula 1A, B may be Cu.

In an embodiment, in Formulae 1A and 1B, $X^1$ and $X^2$ may be the same as each other. For example, in Formulae 1A and 1B, $X^1$ and $X^2$ may be both I.

In an embodiment, the first compound may be $Cs_3CuI_5$, and the second compound may be at least one of NaI, KI, CsI, or RbI.

The luminescent material may emit blue light.

The luminescent material may have a maximum emission wavelength (measured value) of about 420 nm or greater and about 520 nm or smaller. For example, the luminescent material may have a maximum emission wavelength (measured value) of about 420 nm or greater, about 430 nm or greater, about 495 nm or smaller, about 475 nm or smaller, or about 450 nm or smaller. In particular, when the luminescent material has a maximum emission wavelength of about 420 nm to about 475 nm, a light-emitting device having a deep blue emission color may be provided.

The luminescent material may have a full width at half maximum (FWHM) of about 100 nm or less. For example, the luminescent material may have a FWHM of about 90 nm or smaller, about 85 nm or smaller, about 80 nm or smaller, about 75 nm or smaller, about 70 nm or smaller, about 50 nm or smaller, about 30 nm or smaller, or about 20 nm or smaller. The smaller the FWHM, the higher the color purity may become, and the higher the emission efficiency in a desired wavelength range may become. For example, the luminescent material may have a FWHM of about 90 nm to about 10 nm, or from 70 nm to 10 nm.

Not limited by any stated theory, in the luminescent material represented by Formula 1, the second compound may compensate for defects at the boundary of the first compound, and thus the luminescent material may have an increased photoluminescence quantum yield (PLQY).

Again, not limited by any stated theory because stabilization of $X^2$ in the first compound significantly can affect the improvement in PLQY of the luminescent material, the improvement rate of PLQY may be increased when $X^2$ of the first compound and $X^1$ of the second compound are the same.

Currently available examples of inorganic compounds or organic-inorganic complex compounds that exhibit commercially available performance in terms of emission characteristics and/or stability include, those elements known to cause environmental problems such as cadmium and lead. However, the luminescent material represented by Formula 1 may achieve emission characteristics and/or stability to commercially available levels without including such as cadmium or lead, and thus not cause environmental problems A person skill in the art would understand a method of preparing the luminescent material represented by Formula 1 with reference to the following preparation methods and synthesis examples described below.

Method of Preparing Luminescent Material

According to an embodiment, there is provided a method of preparing a luminescent material represented by Formula 1, the method including: providing, onto a substrate, a mixture including at least one of $A^2X^2$-containing precursors, at least one of $BX^2$-containing precursors, at least one of $A^1X^1$-containing precursors, and a solvent; performing crystallization by adding an antisolvent; and removing the solvent and the antisolvent by thermal treatment.

First, a mixture including at least one of $A^2X^2$-containing precursors, at least one of a $BX^2$-containing precursor, at least one of $A^1X^1$-containing precursors, and a solvent may be provided onto a substrate.

In the mixture, a molar ratio of the at least one of $A^2X^2$-containing precursors, the at least one of $BX^2$-containing precursors, and the at least one of $A^1X^1$-containing precursors may be determined according to the composition of the luminescent material represented by Formula 1 which is finally produced. For example, in the mixture, a value of {the sum of the atomic ratio of $A^2$ and the atomic ratio of $A^1$}/{the atomic ratio of B} may be about 1.5 or greater. For example, in the mixture, a value of {the sum of the atomic ratio of $A^2$ and the atomic ratio of $A^1$}/{the atomic ratio of B} may be about 1.5+n/2. This may allow excess $A^1X^1$ to participate in boundary stabilization rather than participate in the crystal lattice.

In particular, in the luminescent material represented by Formula 1 a ratio of the atomic ratio of $A^2$ to the atomic ratio of B may be about 3:2, and a ratio of the atomic ratio of $A^2$ to the atomic ratio of $A^1$ may be about 3:n. Accordingly, the composition of the mixture may be determined to satisfy these ranges.

A molar ratio of the at least one of the $A^2X^2$-containing precursors to the at least one of the $A^1X^1$-containing precursors may be determined according to the value of n in Formula 1 of the luminescent material. For example, a molar ratio of the at least one of the $A^2X^2$-containing precursors to the at least one of the $A^1X^1$-containing precursors is greater than 100:0 to less than 100:50, greater than 100:0 to 100:40 or less, greater than 100:0 to 100:30 or less, greater than 100:0 to 100:20 or less, greater than 100:0 to 100:10 or less, greater than 100:0 to 100:5 or less, greater than 100:0 to 100:3 or less, or greater than 100:0 to 100:2 or less. However, embodiments are not limited thereto.

For example, the mixture may be spin-coated on the substrate. When the mixture is provided by spin coating, the spin coating conditions may be selected within, for example, the range of a coating speed of about 300 revolutions per minute (rpm) to about 6000 rpm, depending upon the composition of the mixture. In particular, the coating speed may be controlled to be different according to intervals. For example, the coating speed may be maintained at about 300 rpm to about 700 rpm in a first interval, and at about 2000 rpm to about 6000 rpm in a second interval.

The mixture may be provided on the substrate by using any of various known methods.

The solvent may be a solvent in which $A^2X^2$-containing precursors, $A^1X^1$-containing precursors, and $BX^2$-containing precursors have high solubility. For example, the solvent may be dimethyl formamide, dimethyl sulfoxide (DMSO), γ-butyrolactone, N-methyl-2-pyrrolidone, or a combination thereof. However, embodiments are not limited thereto.

Next, crystallization may be performed by adding an antisolvent onto the substrate to which the mixture has been provided.

For example, when the mixture is provided by spin coating, after the mixture is spin-coated, the antisolvent may be added by, for example, dropwise addition or spraying, while the substrate is continuously rotated.

The anti-solvent may be an anti-solvent in which $A^2X^2$-containing precursors, $A^1X^1$-containing precursors, and $BX^2$-containing precursors have low solubility. For example, the antisolvent may be diethyl ether, toluene, α-terpineol, hexyl carbitol, butyl carbitol acetate, hexyl cellosolve, butyl cellosolve acetate, or any combination thereof. However, embodiments are not limited thereto. For example, the antisolvent may be diethyl ether.

Next, the solvent and the antisolvent may be removed by thermal treatment.

For example, the thermal treatment conditions may be selected within, for example, the range of time of about 15 minutes to 2 hours and the range of temperatures of about 50° C. to about 200° C., depending upon the composition of the mixture.

In regard to the $A^2X^2$-containing precursors, the $A^1X^1$-containing precursors, the $BX^2$-containing precursors, $A^1$, $A^2$, B, $X^1$, and $X^2$ may be defined as described above in connection with Formula 1.

For example, the $A^2X^2$-containing precursor may be halides of $A^2$ and $X^2$ (for example, $A^2X^2$), the $A^1X^1$-containing precursor may be halides of $A^1$ and $X^1$ (for example, $A^1X^1$), and the $BX^2$-containing precursor may be halides of B and $X^2$ (for example, $BX^2$). In the formulae of $A^2X^2$, $A^1X^1$, and $BX^2$, $A^1$, $A^2$, B, $X^1$, and $X^2$ may be defined as described above in connection with Formula 1.

Light-Emitting Device

Figure 1:
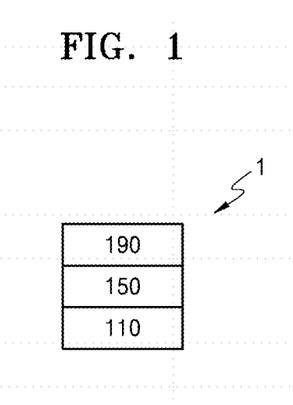
FIG. 1 is a schematic cross-sectional view of a light-emitting device according to an embodiment.

According to an embodiment, as illustrated in FIG. 1, a light-emitting device 1 may include: a first electrode 110; a second electrode 190 opposite to the first electrode 110; and an emission layer 150 interposed between the first electrode 110 and the second electrode 190, the emission layer 150 containing the above-described luminescent material.

A structure of the light-emitting device 1 will be described with reference to FIG. 1. FIG. 1 is a schematic cross-sectional view of the light-emitting device 1 according to an embodiment.

Although not shown in FIG. 1, a substrate may be further arranged under the first electrode 110 (i.e., in the direction opposite to the emission layer 150) and/or on top of the second electrode 190 (i.e., in the direction opposite to the emission layer 150). The substrate may be a substrate used in common light-emitting devices. The substrate may be a glass substrate or a transparent plastic substrate having excellent mechanical strength, thermal stability, transparency, surface smoothness, ease of handling, and water resistance.

The first electrode 110 may be an anode to which a positive (+) voltage is applied, and the second electrode 190 may be a cathode to which a negative (−) voltage is applied. On the contrary, the first electrode 110 may be a cathode, and the second electrode 190 may be an anode. As a matter of convenience, embodiments will be described with the assumption that the first electrode 110 is an anode, and the second electrode 190 is a cathode.

The first electrode 110 may be formed, for example, by depositing or sputtering, onto the substrate, a material for the first electrode. The first electrode 110 may be a reflective electrode, a semi-transmissive electrode, or a transmissive electrode. For example, to obtain a bottom-emission light-emitting device, the first electrode 110 may be a semi-transmissive electrode or a transmissive electrode. To obtain a top-emission light-emitting device, the first electrode 110 may be a reflective electrode. Various other modifications may be possible. The first electrode 110 may have a single-layered structure, or a multi-layered structure including two or more layers.

The first electrode 110 may include a material having a high work function to facilitate injection of holes. For example, a material for the first electrode may include indium tin oxide (ITO), indium zinc oxide (IZO), indium oxide, tin oxide ($SnO_2$), zinc oxide (ZnO), gallium oxide, or any combination thereof. In one embodiment, a material for the first electrode may include magnesium (Mg), aluminum (Al), aluminum-lithium (Al—Li), calcium (Ca), magnesium-indium (Mg—In), magnesium-silver (Mg—Ag), or any combination thereof.

The second electrode 190 may be provided so as to be opposite to the first electrode 110. The second electrode 190 may be a reflective electrode, a semi-transmissive electrode, or a transmissive electrode. For example, to obtain a bottom-emission light-emitting device, the second electrode 190 may be a reflective electrode. To obtain a top-emission light-emitting device, the second electrode 190 may be a semi-transmissive electrode or a transmissive electrode. Various other modifications may be possible. The second electrode 190 may have a single-layered structure, or a multi-layered structure including two or more layers.

The second electrode 190 may include a metal, an alloy thereof, an electrically conductive compound having a relatively low work function and any combination thereof. For example, a material for the second electrode 190 may include lithium (Li), magnesium (Mg), aluminum (Al), aluminum-lithium (Al-Li), calcium (Ca), gallium (Ga), magnesium-indium (Mg—In), magnesium-silver (Mg—Ag), or any combination thereof. In other embodiments, a material for the second electrode may include ITO, IZO, or any combination thereof.

The emission layer 150 may include the luminescent material represented by Formula 1. In the emission layer 150, electrons and holes transferred due to voltages applied to the first electrode 110 and the second electrode 190 may combine. After being generated by the combination of electrons and holes, excitons may emit light while transitioning from an excited state to a ground state. The light-emitting device may have high color purity, high current efficiency, and high quantum efficiency by the inclusion of the above-described luminescent material represented by Formula 1.

The luminescent material may be present in the emission layer at a uniform concentration or with a certain concentration gradient.

When the light-emitting device is a full-color light-emitting device, it may include emission layers emitting different colors of light for respective individual sub-pixels.

For example, the emission layer may be patterned into a first-color emission layer, a second-color emission layer, and a third-color emission layer for individual sub-pixels, respectively. At least one emission layer among these emission layers may essentially include the luminescent material. For example, the first-color emission layer may be an emission layer including the luminescent material, and the second-color emission layer and the third-color emission layer may be organic emission layers including different organic compounds, respectively. The first to third colors may be different colors. For example, the first to third colors may have different maximum emission wavelengths. The first to third colors may become white when combined with each other.

In one or more embodiments, the emission layer may further include a fourth-color emission layer. At least one emission layer of the first-color emission layer to the fourth-color emission layer may be an emission layer including the luminescent material according to any of the above-described embodiments, and the remaining emission layers may be organic emission layers including different organic compounds, respectively. Various other modifications may be possible. The first to fourth colors may be different colors. For example, the first to fourth colors may have different maximum emission wavelengths. The first to fourth colors may become white when combined with each other.

In one or more embodiments, the light-emitting device may have a structure in which two or more emission layers which emit different colors are stacked in contact with each other or separately from each other. At least one emission layer of the two or more emission layers may be an emission layer including the luminescent material according to any of the above-described embodiments, and the remaining emission layers may be organic emission layers including different organic compounds, respectively. Various other modifications may be possible.

The emission layer 150 may further include, in addition to the luminescent material represented by Formula 1, at least one of an organic compound, an inorganic compound, an organic-inorganic composite compound, and quantum dots. However, embodiments are not limited thereto.

The emission layer 150 may have a thickness of about 10 nm to about 200 nm, for example, about 50 nm to about 100 nm. When the thickness of the emission layer 150 is within these ranges, the emission layer 150 may exhibit excellent emission characteristics without an increase in substantial driving voltage.

An additional layer for adjusting the charge carrier balance in the device may be further included between the first electrode 110 and the emission layer 150 and/or between the second electrode 190 and the emission layer 150, in order to improve device characteristics such as emission efficiency. For example, the light-emitting device may further include a hole transport region between the first electrode 110 and the emission layer 150, and an electron transport region between the second electrode 190 and the emission layer 150.

The hole transport region may inject and/or transport holes from the first electrode 110 to the emission layer 150. In addition, the hole transport region may increase efficiency by compensating for an optical resonance distance which is dependent on the wavelength of light emitted from the emission layer 150.

The hole transport region may include at least one of a hole injection layer, a hole transport layer, and a charge control layer. The hole transport region may have a single-layer structure or a multi-layer structure including two or more layers. For example, the hole transport region may include only a hole injection layer or a hole transport layer. In some embodiments, the hole transport region may have a stacked structure of a hole injection layer/hole transport layer or a hole injection layer/hole transport layer/charge control layer, these layers being sequentially stacked on the first electrode 110.

The hole transport region may include, for example, mCP (1,3-bis(9-carbazolyl)benzene), CBP (4,4'-bis(N-carbazolyl)-1,1'-biphenyl), mCBP (3,3-bis(carbazol-9-yl)bipheny), m-MTDATA (4,4',4"-tris[phenyl(m-tolyl)amino]triphenylamine), TDATA, 2-TNATA, NPB (N, N'-di(1-naphthyl)-N,N'-diphenyl-(1,1'-biphenyl)-4,4'-diamine), β-NPB, TPD (N,N'-bis(3-methylphenyl)-N,N'-diphenylbenzidine), Spiro-TPD, Spiro-NPB, methylated-NPB, TAPC, HMTPD, TCTA (tris(4-carbazoyl-9-ylphenyl)amine), Pani/DBSA (polyaniline/dodecylbenzenesulfonic acid), PEDOT/PSS (poly(3,4-ethylenedioxythiophene)/poly(4-styrenesulfonate), TFB (poly(9,9-dioctyl-fluorene-co-N-(4-butylphenyl)-diphenylamine)), polyarylamine, PVK (poly(N-vinylcarbazole)), polypyrrole, Pani/CSA (polyaniline/camphor sulfonic acid), or PANI/PSS (polyaniline)/poly(4-styrenesulfonate)). However, embodiments are not limited thereto.

m-MTDATA

TDATA

-continued

2-TNATA

NPB

β-NPB

TPD

Spiro-TPD

Spiro-NPB methylated NPB

TAPC

HMTPD

The thickness of the hole transport region may be determined in consideration of the wavelength of light emitted from the emission layer, the driving voltage and current efficiency of the light-emitting device, or the like. For example, the hole transport region may have a thickness of about 10 nm to about 1000 nm, for example, about 10 nm to about 100 nm. When the hole transport region includes both a hole injection layer and a hole transport layer, the hole injection layer may have a thickness of about 10 nm to about 200 nm, and the hole transport layer may have a thickness of about 5 nm to about 100 nm.

The hole transport region may further include a p-dopant, in addition to the above-described materials, to improve conductivity. The p-dopant may be uniformly or non-uniformly dispersed in the hole transport region.

The p-dopant may be one of a quinone derivative, a metal oxide, and a cyano group-containing compound. However, embodiments are not limited thereto. Non-limiting examples of the p-dopant are quinine derivatives such as tetracyanoquinonedimethane (TCNQ) and 2,3,5,6-tetrafluoro-tetracyano-1,4-benzoquinonedimethane (F4-TCNQ); metal oxides such as tungsten oxide and molybdenum oxide; and cyano group-containing compounds such as compound HAT-CN (dipyrazino[2,3-f:2',3'-h]quinoxaline-2,3,6,7,10,12-hexacarbonitrile). However, embodiments are not limited thereto.

The electron transport region may inject and/or transport electrons from the second electrode 190 to the emission layer 150. In addition, the electron transport region may increase efficiency by compensating for an optical resonance distance according to a wavelength of light emitted from the emission layer.

The electron transport region may include at least one of an electron injection layer, an electron transport layer, and a charge control layer. The electron transport region may have a single-layer structure or a multi-layer structure including two or more layers. For example, the electron transport region may include only an electron injection layer or an electron transport layer. In some embodiments, the hole transport region may have a stacked structure of an electron transport layer/electron injection layer or a charge control layer/electron transport layer/electron injection layer, these layers being sequentially stacked on the emission layer 150.

For example, the electron transport region may include at least one of $Alq_3$, BCP (Bathocuproine), Bphen (4,7-diphenyl-1,10-phenanthroline), BAlq (bis(2-methyl-8-quinolinolato-N1,O8)-(1,1'-biphenyl-4-olato)aluminum), TAZ (3-(Biphenyl-4-yl)-5-(4-tert-butylphenyl)-4-phenyl-4H-1,2,4-triazole), NTAZ (4-(naphthalen-1-yl)-3,5-diphenyl-4H-1,2,4-triazole) $Bebq_2$ (bis(10-hydroxybenzo[h]quinolinato) beryllium), B3PYMPM, TPBI, 3TPYMB, BmPyPB, TmPyPB, BSFM, PO-T2T, and PO15. However, embodiments are not limited thereto. For example, the electron transport layer and/or the charge control layer may include at least one of the above-listed compounds. However, embodiments are not limited thereto.

B3PYMPM

TPBI

3TPYMB

BmPyPB

TmPyPB

BSFM

PO-T2T

PO15

For example, the electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof, or may further include an organic compound as listed above. However, embodiments are not limited thereto.

In one or more embodiments, the electron injection layer may include LiF, NaF, CsF, KF, Li$_2$O, Cs$_2$O, K$_2$O, BaO, SrO, CaO, 8-quinolinolato lithium (LiQ), or a combination thereof, or may further include an organic compound as listed above. However, embodiments are not limited thereto.

The thickness of the electron transport region may be determined in consideration of the wavelength of light emitted from the emission layer, the driving voltage and current efficiency of the light-emitting device, or the like. For example, the electron transport region may have a thickness of about 1 nm to about 1000 nm, for example, about 1 nm to about 200 nm. When the electron transport region includes both an electron injection layer and an electron transport layer, the electron injection layer may have a thickness of about 1 nm to about 50 nm, and the electron transport layer may have a thickness of about 5 nm to about 100 nm.

The charge control layer may be included to control charge-injection balance in the interface between an organic compound-containing layer (for example, the hole transport layer, the electron transport layer, or the like) and an inorganic compound-containing layer (for example, the emission layer). The charge control layer may include, for example, a polymer compound such as PMMA (poly(methyl methacrylate)), PI (polyimide), PVA (polyvinyl alcohol), any combination thereof, or a copolymer thereof. However, embodiments are not limited thereto. By the inclusion of the charge control layer, the light-emitting device may have improved charge injection balance and increased external quantum efficiency. In addition, since the charge control layer is located immediately adjacent to the emission layer, the emission layer may be planarized, and a driving voltage of the light-emitting device may be reduced.

In one or more embodiments, the light-emitting device may include a hole transport region interposed between the first electrode and the emission layer, and/or an electron transport region interposed between the emission layer and the second electrode.

In one or more embodiments, the light-emitting device may include a charge control layer between the first electrode and the emission layer and/or between the emission layer and the second electrode.

The layers of the light-emitting device 1 may be formed by using any of a variety of methods, for example, vacuum deposition, spin coating, casting, or Langmuir-Blodgett (LB) deposition.

When the hole injection layer is formed by using vacuum deposition, the vacuum deposition conditions may vary depending on the material of the hole injection layer, and the desired structure and thermal properties of the hole injection layer to be formed. For example, the deposition temperature may be in a range of about 100° C. to about 500° C., the vacuum level may be in a range of about $10^{-8}$ torr to about $10^{-3}$ torr, and the deposition rate may be in a range of about 0.01 Angstroms per second (Å/sec) to about 100 Å/sec. However, embodiments are not limited thereto.

When the hole injection layer is formed by using spin coating, the coating conditions may vary depending on the material of the hole injection layer, and the desired structure and thermal properties of the hole injection layer to be formed. For example, the spin coating rate may be in a range of about 2000 revolutions per minute (rpm) to about 5000 rpm, and the temperature of the thermal treatment performed to remove a solvent after the spin coating may be in a range of about 80° C. to about 200° C. However, embodiments are not limited thereto.

Above, the light-emitting device according to embodiments has been described with reference to FIG. 1, but is not limited thereto.

One or more embodiments of the present disclosure will now be described in detail with reference to the following synthesis examples and other examples of the luminescent material, a method of preparing the luminescent material, and a light-emitting device including the luminescent material. However, these examples are for illustrative purposes only and are not intended to limit the scope of the present disclosure. In the following synthesis examples, the expression that 'B', instead of 'A', was used" means that the amounts of 'B' and 'A' were the same in molar equivalent.

EXAMPLES

Analysis Methods (1) PL Spectroscopy

A luminescent material was applied to a glass substrate to form a film having a thickness of 200 to 400 nm. The film was then excited under a nitrogen atmosphere using excitation light having a wavelength of 290 nm, and a photoluminescence (PL) spectrum of the film was measured at room temperature using an ISC PC1 spectrofluorometer.

(2) PLQY Measurement

A luminescent material was applied to a glass substrate to form a film having a thickness of 200 to 400 nm. The film was then excited under nitrogen atmosphere using excitation light having a wavelength of 290 nm, and a photoluminescence quantum yield (PLQY) of the film was measured using a C9920-02 and PMA-11 (available from Hamamatsu Photonics).

(3) XRD Analysis

Samples were analyzed using an X-ray diffractometer (XRD, Philips X'pert) equipped with a Cu target in a 2θ scan mode at a scanning rate of 4°/min and an angle of 10° to 90°.

(4) EDX Analysis

Energy dispersive X-ray spectroscopy (EDX) was performed using a Shimadzu EDX-7000 to obtain an EDS peak analysis graph, and $A^1X^1$ not involved in the crystal lattice was analyzed using the eZAF Smart Quant Results.

Synthesis Example: Preparation of Luminescent Material Represented by Formula 1

Mixtures 1 to 11, and A (chemistry as shown in Table 1, a $A^2X^2$-containing precursor, a $BX^2$-containing precursor, a $A^1X^1$-containing precursor, and a solvent in a predetermined molar ratio) were spin-coated on glass substrates, respectively, at 500 rpm for 30 seconds, and subsequently at 2000 to 4000 rpm for 30 seconds. At the time of 20 seconds from the beginning of the second spin coating, diethyl ether was dropwise added at a rate of 2 milliliters (mL) per second for 0.5 seconds. The resulting products were thermally treated at 100° C. to 150° C. for 10 minutes, thereby forming glass substrates coated with luminescent materials (Examples 1-1 to 1-5, Examples 2-1 to 2-4, Examples 3-1 to 3-4, Examples 4-1 to 4-4, and Comparative Examples 1-1 and 1-2) (each having a final composition as shown in Table 2) to a thickness of 200 to 400 nm.

TABLE 1

| Mixture No. | $A^2X^2$ precursor | $BX^2$ precursor | $A^1X^1$ precursor | Solvent | Amount Ratio $^a$ | Precursor concentration (molar) |
|---|---|---|---|---|---|---|
| Mixture 1-1 | CsI | CuI | NaI | DMSO | 3:2:0.06 | 2.5 |
| Mixture 1-2 | CsI | CuI | NaI | DMSO | 3:2:0.09 | 2.5 |
| Mixture 1-3 | CsI | CuI | NaI | DMSO | 3:2:0.15 | 2.5 |
| Mixture 1-4 | CsI | CuI | NaI | DMSO | 3:2:0.30 | 2.5 |
| Mixture 1-5 | CsI | CuI | NaI | DMSO | 3:2:0.60 | 2.5 |
| Mixture 2-1 | CsI | CuI | KI | DMSO | 3:2:0.06 | 2.5 |
| Mixture 2-2 | CsI | CuI | KI | DMSO | 3:2:0.09 | 2.5 |
| Mixture 2-3 | CsI | CuI | KI | DMSO | 3:2:0.15 | 2.5 |

TABLE 1-continued

| Mixture No. | $A^2X^2$ precursor | $BX^2$ precursor | $A^1X^1$ precursor | Solvent | Amount Ratio [a] | Precursor concentration (molar) |
|---|---|---|---|---|---|---|
| Mixture 2-4 | CsI | CuI | KI | DMSO | 3:2:0.30 | 2.5 |
| Mixture 3-1 | CsI | CuI | CsI | DMSO | 3:2:0.06 | 2.5 |
| Mixture 3-2 | CsI | CuI | CsI | DMSO | 3:2:0.09 | 2.5 |
| Mixture 3-3 | CsI | CuI | CsI | DMSO | 3:2:0.15 | 2.5 |
| Mixture 3-4 | CsI | CuI | CsI | DMSO | 3:2:0.30 | 2.5 |
| Mixture 4-1 | CsI | CuI | RbI | DMSO | 3:2:0.06 | 2.5 |
| Mixture 4-2 | CsI | CuI | RbI | DMSO | 3:2:0.09 | 2.5 |
| Mixture 4-3 | CsI | CuI | RbI | DMSO | 3:2:0.15 | 2.5 |
| Mixture 4-4 | CsI | CuI | RbI | DMSO | 3:2:0.30 | 2.5 |
| Comp. Mixture 1-1 | CsI | CuI | — | DMSO | 3:2:0 | 2.5 |
| Comp. Mixture 1-2 | CsI | CuI | NaI | DMSO | 2:2:1 | 2.5 |

[a] Molar ratio of $A^2X^2$-containing precursor to $BX^2$-containing precursor to $A^1X^1$-containing precursor

TABLE 2

| Mixture No. | Final product (Luminescent material) | Atomic composition of final product |
|---|---|---|
| Mixture 1-1 | Example 1-1 | $Na_{0.06}Cs_3Cu_2I_{5.06}$ |
| Mixture 1-2 | Example 1-2 | $Na_{0.09}Cs_3Cu_2I_{5.09}$ |
| Mixture 1-3 | Example 1-3 | $Na_{0.15}Cs_3Cu_2I_{5.15}$ |
| Mixture 1-4 | Example 1-4 | $Na_{0.30}Cs_3Cu_2I_{5.30}$ |
| Mixture 1-5 | Example 1-5 | $Na_{0.60}Cs_3Cu_2I_{5.60}$ |
| Mixture 2-1 | Example 2-1 | $K_{0.06}Cs_3Cu_2I_{5.06}$ |
| Mixture 2-2 | Example 2-2 | $K_{0.09}Cs_3Cu_2I_{5.09}$ |
| Mixture 2-3 | Example 2-3 | $K_{0.15}Cs_3Cu_2I_{5.15}$ |
| Mixture 2-4 | Example 2-4 | $K_{0.30}Cs_3Cu_2I_{5.30}$ |
| Mixture 3-1 | Example 3-1 | $Cs_{0.06}Cs_3Cu_2I_{5.06}$ |
| Mixture 3-2 | Example 3-2 | $Cs_{0.09}Cs_3Cu_2I_{5.09}$ |
| Mixture 3-3 | Example 3-3 | $Cs_{0.15}Cs_3Cu_2I_{5.15}$ |
| Mixture 3-4 | Example 3-4 | $Cs_{0.30}Cs_3Cu_2I_{5.30}$ |
| Mixture 4-1 | Example 4-1 | $Rb_{0.06}Cs_3Cu_2I_{5.06}$ |
| Mixture 4-2 | Example 4-2 | $Rb_{0.09}Cs_3Cu_2I_{5.09}$ |
| Mixture 4-3 | Example 4-3 | $Rb_{0.15}Cs_3Cu_2I_{5.15}$ |
| Mixture 4-4 | Example 4-4 | $Rb_{0.30}Cs_3Cu_2I_{5.30}$ |
| Comp. mixture 1-1 | Comp. Example 1-1 | $Cs_3Cu_2I_5$ |
| Comp. mixture 1-2 | Comp. Example 1-2 | $Na_1Cs_2Cu_2I_5$ |

Experimental Example 1: XRD Analysis

Figure 2:
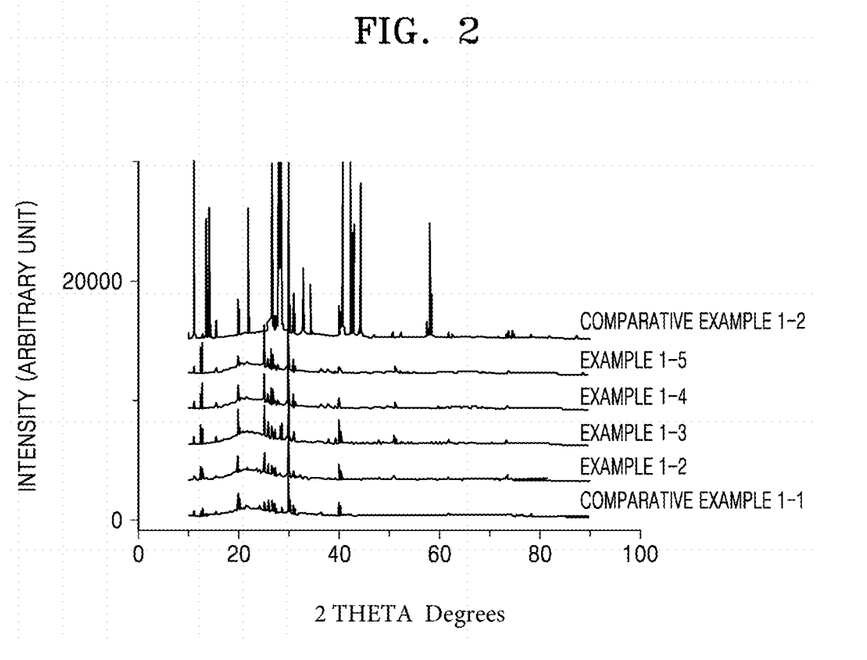
FIG. 2 illustrates the results of X-ray diffraction (XRD) analysis of luminescent materials of Comparative Examples 1-1 and 1-2 and Examples 1-2 to 1-5.

The luminescent materials of Examples 1-2 to 1-5 and Comparative Examples 1-1 and 1-2 were analyzed by X-ray diffractometry (XRD). The results are shown in FIG. 2. Referring to FIG. 2, it was found that the luminescent materials of Examples 1-2 to 1-5 had a $Cs_3Cu_2I_5$ crystal lattice, and excess $A^1X^1$(NaI) was not present in the crystal lattice, and is believed to participate in boundary stabilization.

Experimental Example 2: EDX Analysis

Figure 3A:
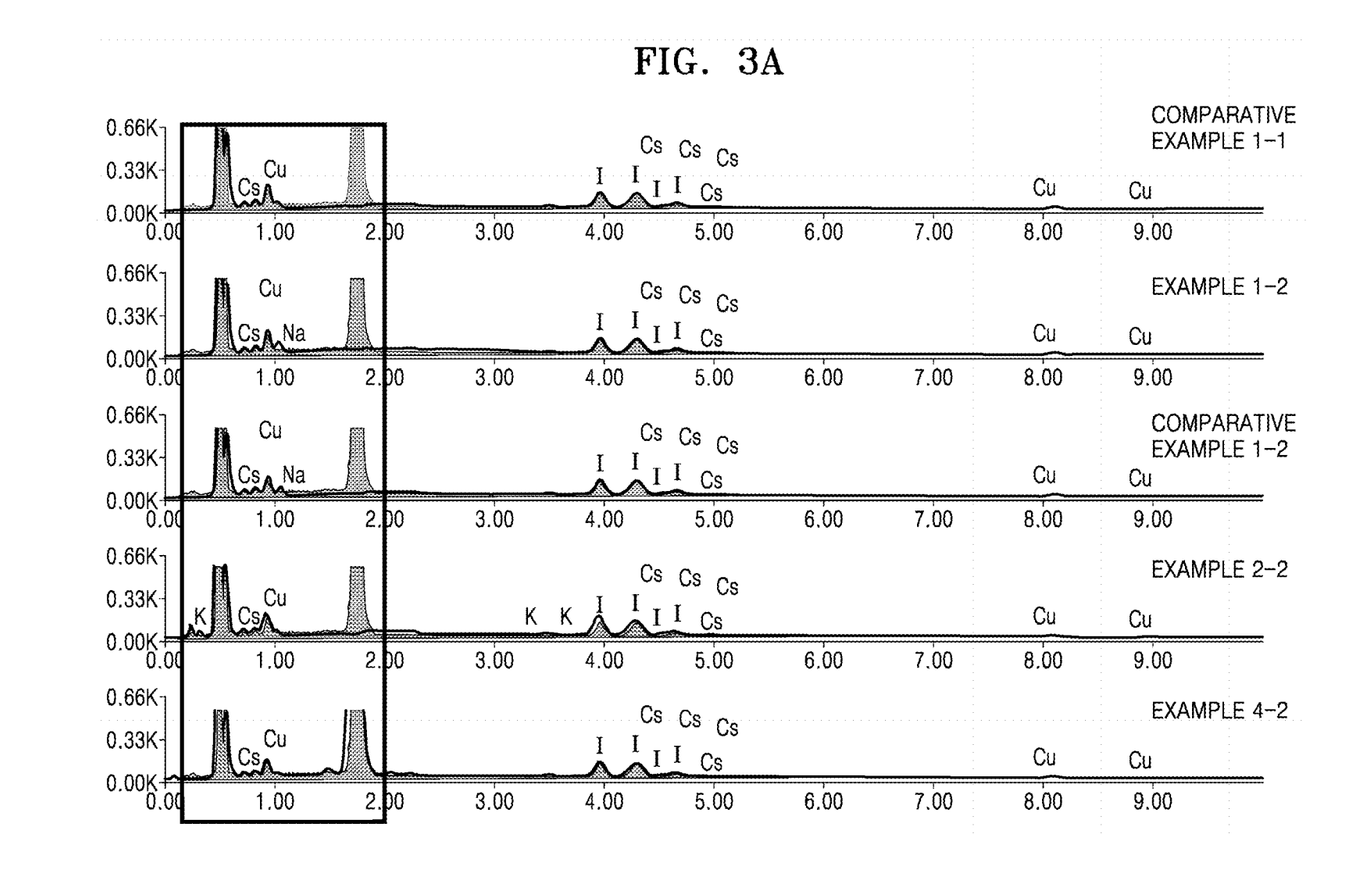
FIG. 3A illustrates the results of energy dispersive X-ray spectroscopy (EDX) performed on the luminescent materials of Comparative Examples 1-1 and 1-2 and Examples 1-2, 2-2, and 4-2.
Figure 3B:
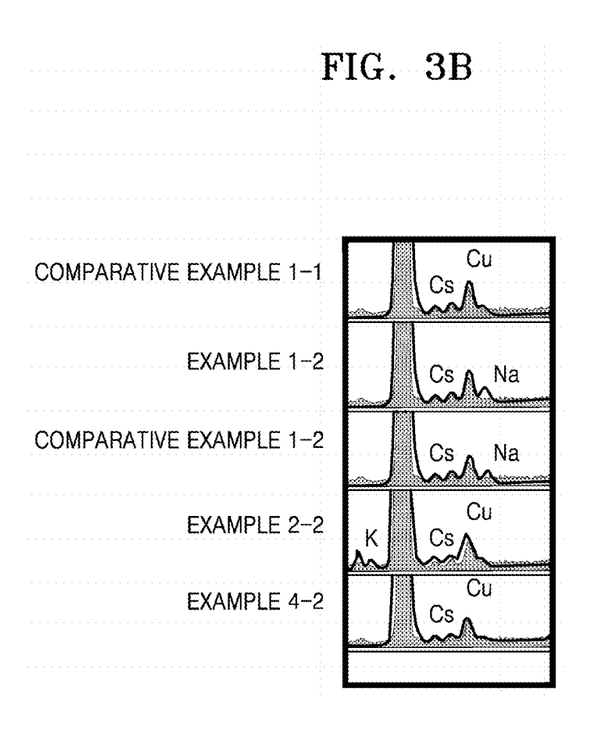
FIG. 3B is a partial magnified view of FIG. 3A.

The luminescent materials of Example 1-2, Example 2-2, Example 4-2, and Comparative Examples 1-1 and 1-2 were analyzed by energy dispersive X-ray spectroscopy (EDX). The results are shown in FIG. 3A. FIG. 3B is a partial magnified view of FIG. 3A. Referring to FIGS. 3A and 3B, the luminescent materials of Example 1-2, Example 2-2, and Example 4-2 were found to include Na and K, respectively.

Referring to FIGS. 2, 3A, and 3B, the data clearly confirms that the luminescent materials according to embodiments of the present invention further include atom $A^1$ that is not present in the $A^2{}_3B_2X^2{}_5$ crystal lattice.

Experimental Example 3: SEM Observation

Figure 4:
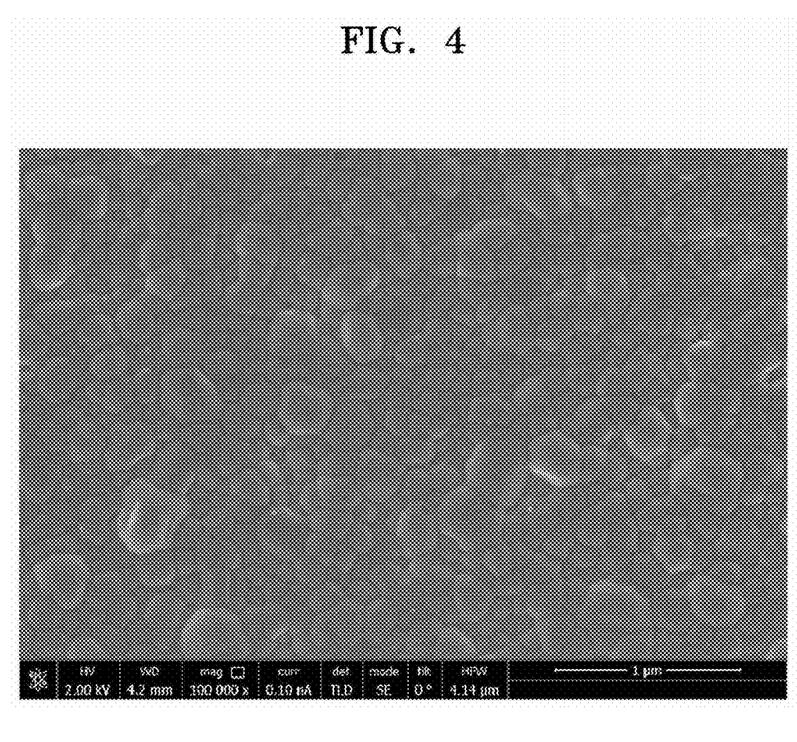
FIG. 4 is a scanning electron microscope (SEM) image of the luminescent material of Example 1-2.

The luminescent material of Example 1-2 was analyzed by scanning electron microscopy (SEM). The obtained SEM image is shown in FIG. 4.

Experimental Example 4: PLQY Measurement

Photoluminescence quantum yields (PLQYs) of the luminescent materials of Examples 1-1 to 1-5, Examples 2-1 to 2-4, Examples 3-1 to 3-4, Examples 4-1 and 4-2, and Comparative Example 1-1 were measured. The results are shown in Table 3 and FIG. 5. A percent change in PLQY was calculated using the equation (1).

Figure 5:
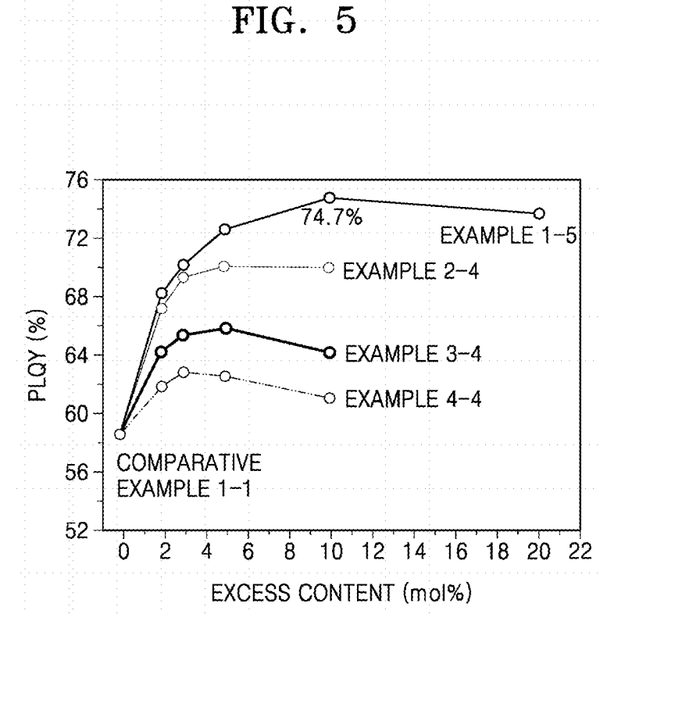
FIG. 5 is a graph illustrating photoluminescence quantum yields (PLQYs) of the luminescent materials of Comparative Example 1-1, Examples 1-1 to 1-5, Examples 2-1 to 2-4, Examples 3-1 to 3-4, and Examples 4-1 to 4-4.

(1){(PLQY of Example $X$)−(PLQY of Comp. Ex. 1-1)}/(PLQY of Comp. Ex. 1-1)×100

The results are shown in Table 3. Here, Example X was one of the luminescent materials of Examples 1-1 to 1-5, Examples 2-1 to 2-4, Examples 3-1 to 3-4, and Examples 4-1 to 4-2.

TABLE 3

| | Atomic composition of final product | PLQY (%) | Change in PLQY (%) |
|---|---|---|---|
| Example 1-1 | $Na_{0.06}Cs_3Cu_2I_{5.06}$ | 68.2 | 16 |
| Example 1-2 | $Na_{0.09}Cs_3Cu_2I_{5.09}$ | 70.1 | 20 |
| Example 1-3 | $Na_{0.15}Cs_3Cu_2I_{5.15}$ | 72.5 | 24 |
| Example 1-4 | $Na_{0.30}Cs_3Cu_2I_{5.30}$ | 74.7 | 27 |
| Example 1-5 | $Na_{0.60}Cs_3Cu_2I_{5.60}$ | 73.6 | 26 |
| Example 2-1 | $K_{0.06}Cs_3Cu_2I_{5.06}$ | 67.1 | 15 |
| Example 2-2 | $K_{0.09}Cs_3Cu_2I_{5.09}$ | 69.2 | 18 |
| Example 2-3 | $K_{0.15}Cs_3Cu_2I_{5.15}$ | 70.0 | 19 |
| Example 2-4 | $K_{0.30}Cs_3Cu_2I_{5.30}$ | 69.9 | 19 |
| Example 3-1 | $Cs_{0.06}Cs_3Cu_2I_{5.06}$ | 64.2 | 10 |
| Example 3-2 | $Cs_{0.09}Cs_3Cu_2I_{5.09}$ | 65.3 | 11 |
| Example 3-3 | $Cs_{0.15}Cs_3Cu_2I_{5.15}$ | 65.7 | 12 |
| Example 3-4 | $Cs_{0.30}Cs_3Cu_2I_{5.30}$ | 64.1 | 9 |
| Example 4-1 | $Rb_{0.06}Cs_3Cu_2I_{5.06}$ | 61.8 | 5 |
| Example 4-2 | $Rb_{0.09}Cs_3Cu_2I_{5.09}$ | 62.8 | 7 |
| Example 4-3 | $Rb_{0.15}Cs_3Cu_2I_{5.15}$ | 62.5 | 7 |
| Example 4-4 | $Rb_{0.30}Cs_3Cu_2I_{5.30}$ | 61.0 | 4 |
| Comparative Example 1-1 | $Cs_3Cu_2I_5$ | 58.6 | — |

Referring to Table 3 and FIG. 5, the luminescent materials of Examples 1-1 to 1-5, Examples 2-1 to 2-4, Examples 3-1 to 3-4, and Examples 4-1 and 4-2 were found to have a higher PLQY than that of the luminescent material of Comparative Example 1-1.

As described above, according to the one or more embodiments, a luminescent material according to the one or more embodiments may have improved emission characteristics, for example, a relatively low FWHM or a relatively high emission efficiency.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A luminescent material represented by Formula 1:

$$[A^1{}_nA^2{}_3][B_2][X^1{}_mX^2{}_5] \quad \text{Formula 1}$$

wherein, in Formula 1,
$A^1$ is at least one of Li, Na, K, Cs, or Rb, and $A^2$ is Cs,
B is at least one of Cu, Ag, or Au,
$X^1$ and $X^2$ are each independently at least one halogen;
n is a real number satisfying $0<n\leq0.9$; and
m is a real number satisfying $0<m\leq0.9$.

2. The luminescent material of claim 1, wherein $A^1$ is at least one of Na, K, Cs, or Rb.

3. The luminescent material of claim 1, wherein B is Cu.

4. The luminescent material of claim 1, wherein $X^1$ and $X^2$ are the same as each other.

5. The luminescent material of claim 1, wherein $X^1$ and $X^2$ are both I.

6. The luminescent material of claim 1, wherein
n is a real number satisfying $0<n\leq0.6$, and
m is a real number satisfying $0<m\leq0.6$.

7. The luminescent material of claim 1, wherein the luminescent material is represented by Formula 1-1:

$$[A^1{}_nCs_3][Cu_2][X^1{}_mI_5] \quad \text{Formula 1-1}$$

wherein, in Formula 1-1,
$A^1$, $X^1$, n, and m are respectively the same as in Formula 1.

8. The luminescent material of claim 1, wherein the luminescent material is a mixture of a first compound represented by Formula 1A and a second compound represented by Formula 1B:

$$[A^2{}_3][B_2][X^2{}_5] \quad \text{Formula 1A}$$

$$A^1X^1 \quad \text{Formula 1B}$$

wherein, in Formulae 1A and 1B,
$A^1$, $A^2$, B, $X^1$, and $X^2$ are respectively the same as in Formula 1.

9. The luminescent material of claim 8, wherein a molar ratio of the first compound to the second compound is about 1:n or about 1:m.

10. The luminescent material of claim 8, wherein
the first compound is $Cs_3CuI_5$, and
the second compound is selected from NaI, KI, CsI, and RbI.

11. The luminescent material of claim 1, wherein the luminescent material has a maximum emission wavelength of about 420 nanometers or greater and about 520 nanometers or less.

12. The luminescent material of claim 1, wherein the luminescent material has a full width at half maximum of about 100 nanometers or less.

13. A method of preparing a luminescent material represented by Formula 1, the method comprising:
providing onto a substrate a mixture including at least one of $A^2X^2$-containing precursors, at least one of $BX^2$-containing precursors, at least one of A'X'-containing precursors, and a solvent;
performing crystallization by adding an anti-solvent; and
removing the solvent and the anti-solvent by thermal treatment:

$$[A^1{}_nA^2{}_3][B_2][X^1{}_mX^2{}_5] \quad \text{Formula 1}$$

wherein, in Formula 1,
$A^1$ is at least one of Li, Na, K, Cs, or Rb, and $A^2$ is Cs,
B is at least one of Cu, Ag, or Au,
$X^1$ and $X^2$ are each independently at least one halogen;
n is a real number satisfying $0<n\leq0.9$; and
m is a real number satisfying $0<m\leq0.9$.

14. The method of claim 13, wherein a molar ratio of the at least one of the $A^2X^2$-containing precursors to the at least one of the $A^1X^1$-containing precursors is greater than about 100:0 to less than about 100:50.

15. The method of claim 13, wherein a molar ratio of the at least one of the $A^2X^2$-containing precursors to the at least one of the $A^1X^1$-containing precursors is greater than about 100:0 to about 100:20 or less.

16. The method of claim 13, wherein
the solvent is dimethyl formamide, dimethyl sulfoxide, γ-butyrolactone, N-methyl-2-pyrrolidone, or any combination thereof, and
the anti-solvent is diethyl ether, toluene, α-terpineol, hexyl carbitol, butyl carbitol acetate, hexyl cellosolve, butyl cellosolve acetate, or any combination thereof.

17. A light-emitting device comprising:
a first electrode;
a second electrode opposite the first electrode; and
an emission layer interposed between the first electrode and the second electrode,
wherein the emission layer comprises the luminescent material of claim 1.

18. The light-emitting device of claim 17, further comprising:
a hole transport region interposed between the first electrode and the emission layer; an electron transport region interposed between the emission layer and the second electrode, or
a hole transport region interposed between the first electrode and the emission layer, and an electron transport region interposed between the emission layer and the second electrode.

19. The light-emitting device of claim 17, further comprising a charge control layer between the first electrode and the emission layer; between the emission layer and the second electrode; or between the first electrode and the emission layer, and between the emission layer and the second electrode.

* * * * *